United States Patent [19]

Waldo, III et al.

[11] Patent Number: 5,485,498

[45] Date of Patent: Jan. 16, 1996

[54] X-RAY INTERFACE AND CONDENSER

[75] Inventors: Whitson G. Waldo, III, Hutto, Tex.; Eric Brodsky; Franco Cerrina, both of Madison, Wis.

[73] Assignee: Motorola, Inc., Schaumburg, Ill.

[21] Appl. No.: 269,593

[22] Filed: Jul. 1, 1994

[51] Int. Cl.⁶ ................................................ G21K 1/06
[52] U.S. Cl. ............................ 378/84; 378/85; 378/145
[58] Field of Search ................................. 378/34, 84, 85, 378/145, 149, 147, 119, 121, 138, 161

[56] References Cited

U.S. PATENT DOCUMENTS

| | | | |
|---|---|---|---|
| 5,031,199 | 7/1991 | Cole et al. | 378/34 |
| 5,142,561 | 8/1992 | Doumas | 378/84 |
| 5,175,755 | 12/1992 | Kumakhov | 378/35 |
| 5,192,869 | 3/1993 | Kumakhov | 250/505.1 |
| 5,204,886 | 4/1993 | Dugdale | 378/34 |
| 5,268,951 | 12/1993 | Flamholz et al. | 378/34 |
| 5,272,714 | 12/1993 | Chen et al. | 372/96 |

FOREIGN PATENT DOCUMENTS 40609101A  3/1994  Japan .......................... 378/34

*Primary Examiner*—David P. Porta
*Assistant Examiner*—Don Wong
*Attorney, Agent, or Firm*—Aaron B. Bernstein

[57] ABSTRACT

An x-ray interface (40) provides increased x-ray collection efficiency for use in x-ray photolithography. The interface (40) comprises a housing (44) having a plurality of mirrored funnels (46) for collecting the x-rays. The mirrored funnels (46) are shaped to partially collimate and focus the x-rays. The interface (40) collects a greater percentage of the available x-rays from an x-ray source, and the interface (40) also permits a greater number of beamlines to be coupled to the x-ray source.

4 Claims, 6 Drawing Sheets

X-RAY INTERFACE AND CONDENSER

The present invention relates, in general, to semiconductor lithography, and more particularly, to semiconductor x-ray lithography.

BACKGROUND OF THE INVENTION

During the production of semiconductor devices using x-ray lithography, x-rays must be collected from a source and directed down a beamline. The x-rays travel down the beamline to devices such as steppers that use x-rays for photolithography. A schematic view representative of an x-ray lithography system is shown in FIG. 1. The x-ray lithography system 10 includes an x-ray source 12, beamlines 14 and x-ray lithography devices 16.

An electron travels down a vacuum tube 18. As the electron travels down the vacuum tube 18, a bending magnet (not shown in this figure) bends the path of the electron. When an electron curves, it emits x-rays at a an angle tangent to the electron's path. A stream of bending electrons constitute the x-ray source 12. The apparatus which accelerates the electrons, providing the x-ray source is commonly referred to as a synchrotron. The x-rays produced by x-ray source 12 are collected by the interface 20 and sent down the beamlines 14.

Conventional x-ray interfaces collect only a small portion of the available x-rays. This can be a significant disadvantage because a significant amount of power is wasted and unavailable for use in the x-ray lithography. Turning now to FIG. 2, FIG. 2 is a cross-sectional view illustrating a conventional interface for channeling the x-rays down beamlines 14. An electron travels down the vacuum tube 18. As the electron curves it emits x-rays tangentially to its path. A typical synchrotron curves the electrons such that a 30 degree fan of x-rays are emitted towards the interface. A portion of the x-rays emitted are collected through slots 34. These x-rays then travel down beamlines 14 to an x-ray photolithography device (not shown in this figure).

Because of the size of the slots 34, each beamline is only able to collect approximately two degrees out of the 30 degrees of x-rays that are available. For the three beamlines 14 at the source (curve in electron path) this amounts to only 20 percent of the available x-rays being used. The remaining 80 percent is absorbed by the wall of tube 18, creating heat.

Additionally, the conventional interface also limits the number of beamlines that can be attached to an x-ray source. The beamlines are attached to the vacuum tube 18 with flanges 38. The size of the flanges 38 limits the proximity of the beamlines, thus the beamlines cannot be spaced as close together as would be desired. The more beamlines that could be attached to an x-ray source, the more x-ray lithography devices that can be supplied by a single x-ray source.

Because the beamlines 14 must be spaced far apart, there is a substantial space between the slots 34. These spaces absorb, as heat, the x-rays not collected by the slots. If not controlled this excess heat can cause the electrons to be deflected in their orbital path, resulting in process control difficulties. Therefore expensive and wasteful cooling mechanisms must be used to control interface temperature.

Furthermore, due to space constraints, in the conventional design the first mirrors for collecting and focusing the beamlines are typically located at least 3 meters down the beamlines from the slots 34. This results in collection of an even narrower portion of the horizontal fan of x-rays.

Consequently, it is desirable to have an x-ray interface that is able to collect a greater percentage of the available x-rays. Also, it is desirable to have an interface that is able to supply a greater number of beamlines from a x-ray source.

DETAILED DESCRIPTION OF THE DRAWINGS

According to one embodiment of the present invention, an x-ray source-beamline interface is provided with a housing that contains mirrored funnels. The mirrored funnels collect and focus x-rays and reflect the x-rays down the beamlines. These mirrored funnels of the interface have a much higher x-ray collection efficiency than prior interfaces. Instead of x-rays being absorbed by the spaces between collection slots, the mirrored funnels collect the x-rays and reflect them to the beamline for use in an x-ray lithography device.

In one embodiment, the mirrored funnels are shaped to collect and collimate the x-rays down the center of the beamlines. In another embodiment, several optical elements work together to focus and collimate the x-rays. These focusing and collimating elements can be conventional mirrors or optical elements used for x-ray collimating.

In another embodiment funnels filled with hollow light pipes or fiber bundles are used to collect and collimate the x-rays. This embodiment provides an efficient means of both collecting and collimating the x-rays.

Figure 3:
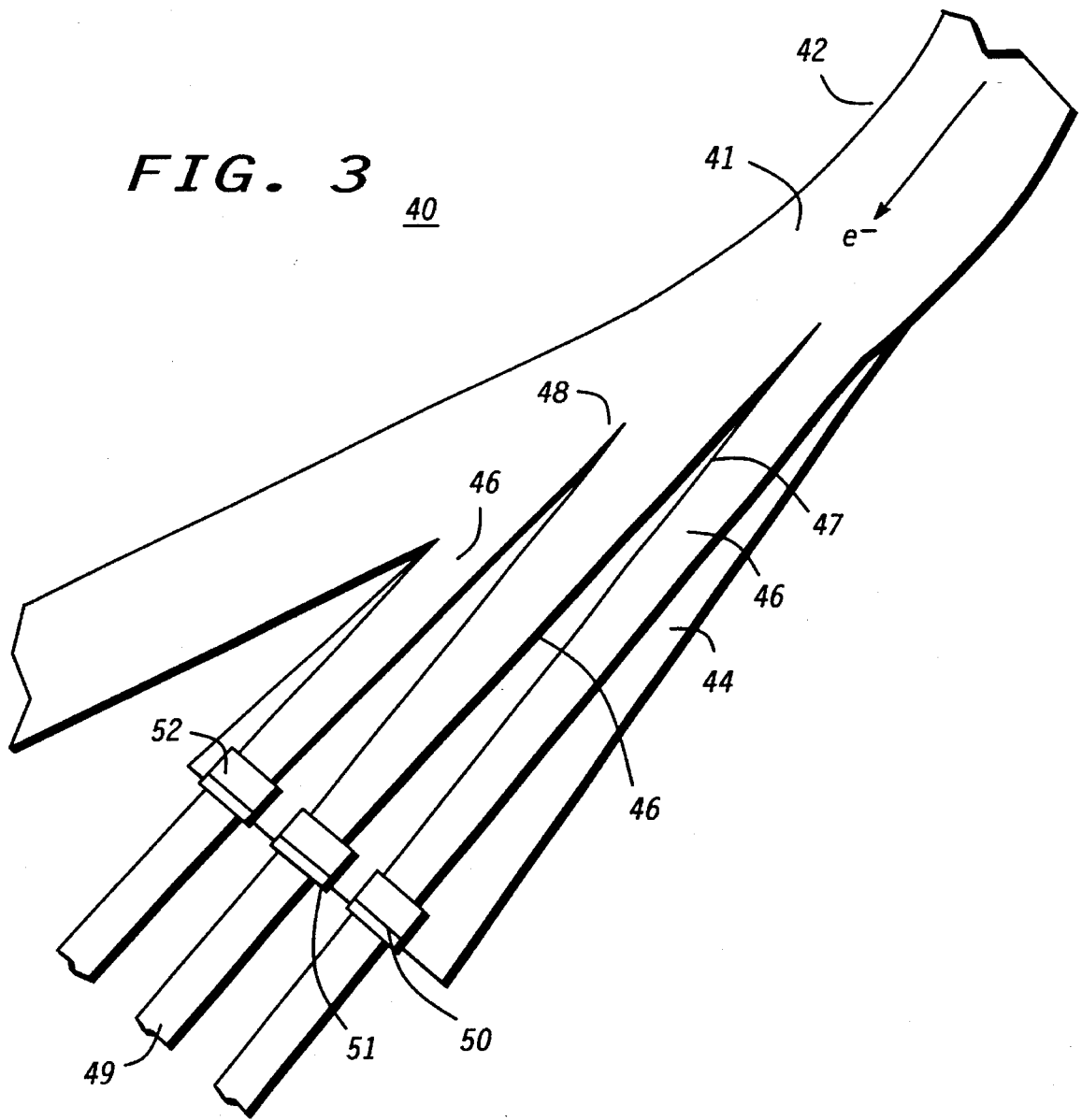
FIG. 3 is a cross-sectional view representing an improved interface.

Turning now to the figures for a more detailed description of the preferred embodiments, FIG. 3 is a cross-sectional view representing an improved interface. An electron travels down a vacuum tube 42. When the electron curves, it emits x-rays, creating an x-ray source 41. An interface 40 is provided that collects x-rays emitted from the x-ray source 41. The x-ray interface 40 includes a housing 44 having a plurality of mirrored funnels 46. The mirrored funnels 46 have receiving ends 48 that collect x-rays emitted from an electron and reflect them to an exiting end 50.

The funnels 46 are lined with mirrors 47 that are shaped to reflect the x-rays to the exiting ends 50. Because of the funnel shaped collectors, the beamlines 49 are able to collect a much higher percentage of the available x-rays. This results in a higher intensity x-ray output to the beamlines 49. The higher intensity of x-rays improves the efficiency of the x-ray photolithography devices by lowering exposure times so throughput is increased. Also, the use of high intensity x-rays enables the use of less sensitive photo resists.

In one embodiment, a collimator 52 is placed at the exiting end of the mirrored funnels 46. The collimator focuses the x-rays into a parallel beam to travel down the beamlines 49. The collimator 52 can include mirrors, hollow reflective light pipes or optical fiber bundles.

Figure 1:
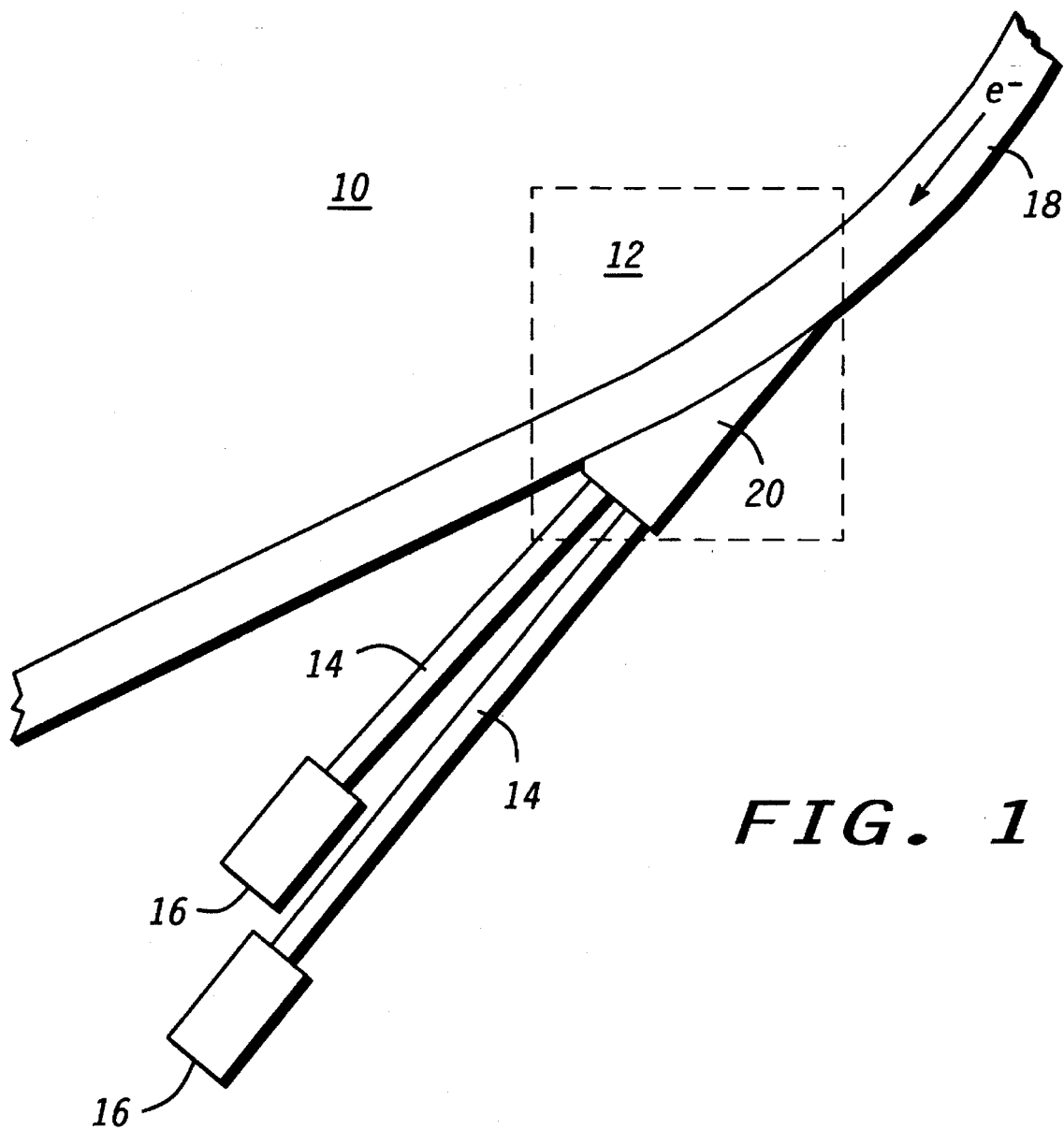
FIG. 1 is a schematic view representing a portion of an x-ray lithography system.
Figure 2:
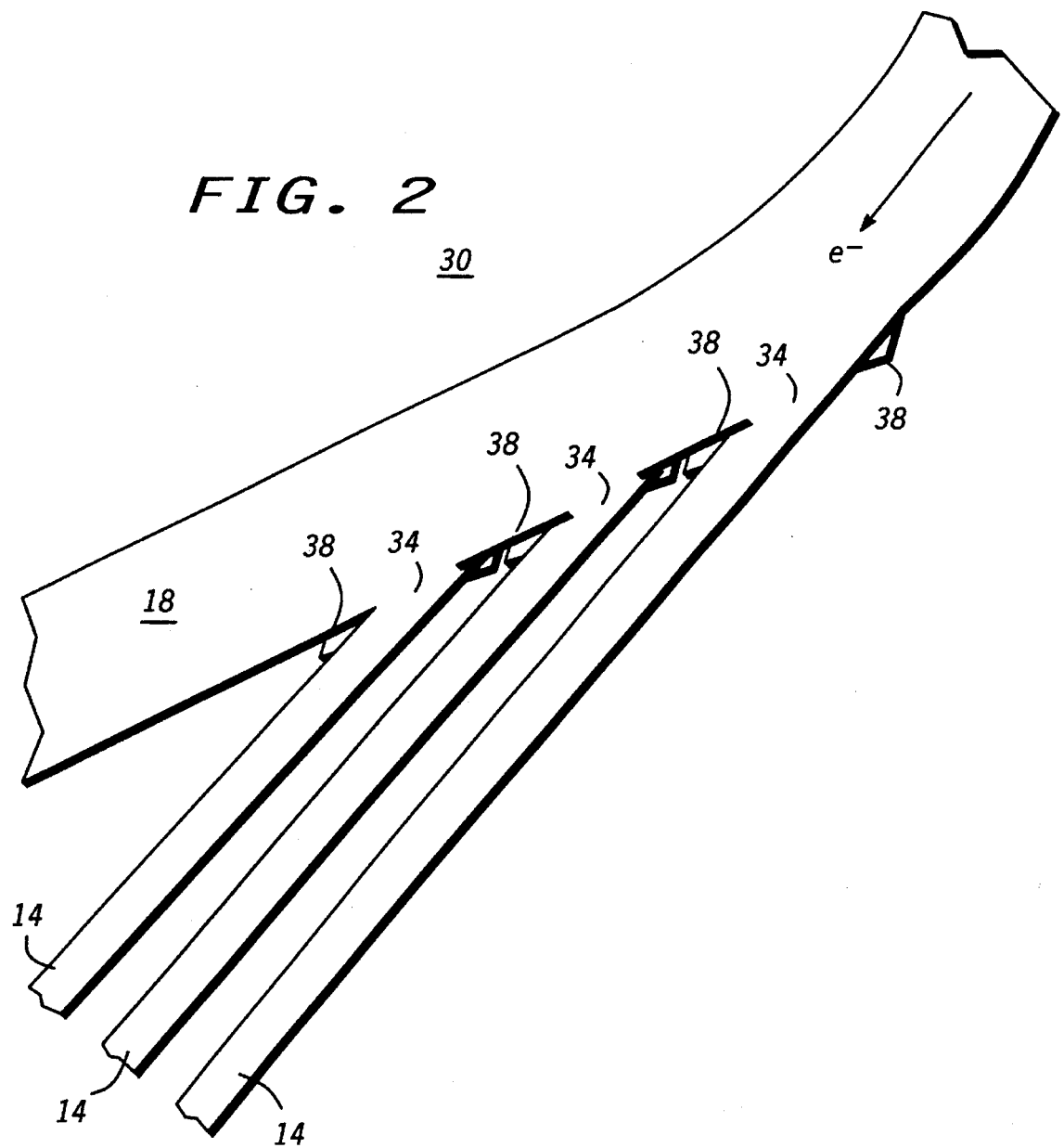
FIG. 2 is a cross-sectional view representing a conventional interface.

The beamlines 49 are attached to the interface 40 with flanges 51 at the exiting ends 50. Because the beamlines 49 are no longer attached directly to the x-ray source 41 (see beamlines 14 and flanges 38 of FIG. 2), the flanges 51 no longer take up excessive space on the source and limit proximity of beamlines at the source. The interface 40 thus provides the ability to attach a greater number of beamlines 49 to the x-ray source 41.

Figure 4:
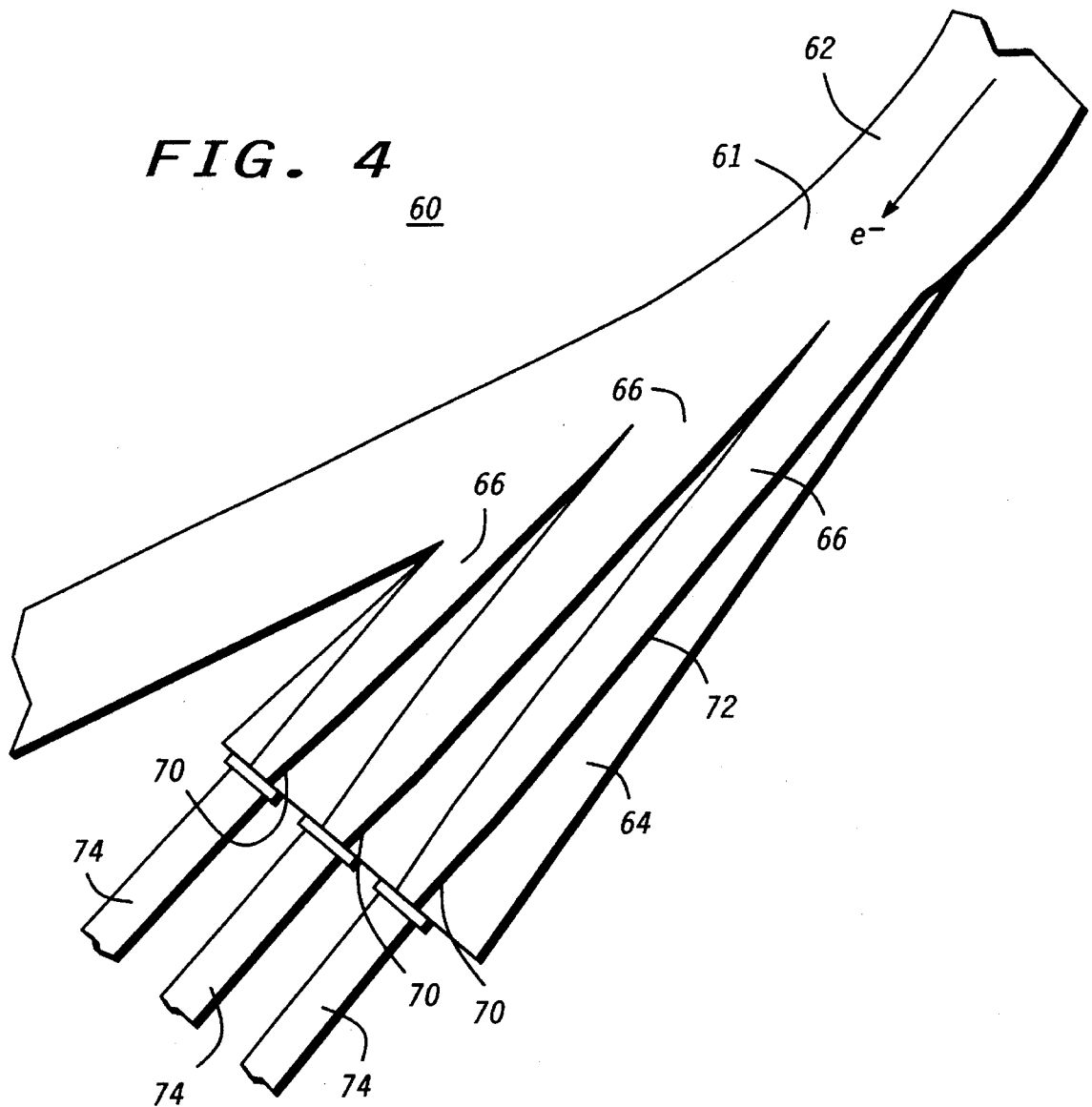
FIG. 4 is a cross-sectional view representing an improved interface.

Turning now to FIG. 4, FIG. 4 is a cross-sectional view representing of an improved interface. An electron stream bending through a vacuum tube 62 provides the x-ray source 61. An interface 60 collects x-rays emitted from an x-ray source 61. The interface 60 comprises a housing 64 containing mirrored funnels 66. The opening of the mirrored funnels 66 constitutes a receiving end of the interface 60. The electrons are collected into the receiving end of mirrored funnels 60 and funneled to the exiting ends 70.

The mirrored funnels are lined with mirrors 72 shaped to collect and collimate the x-rays into a parallel beam for use down the beamlines 74. Because the shape of the mirrors collimates the x-rays, either partially or fully, the need for further focusing required is either totally eliminated or at least not necessary until well down the beamline 74.

Figure 5:
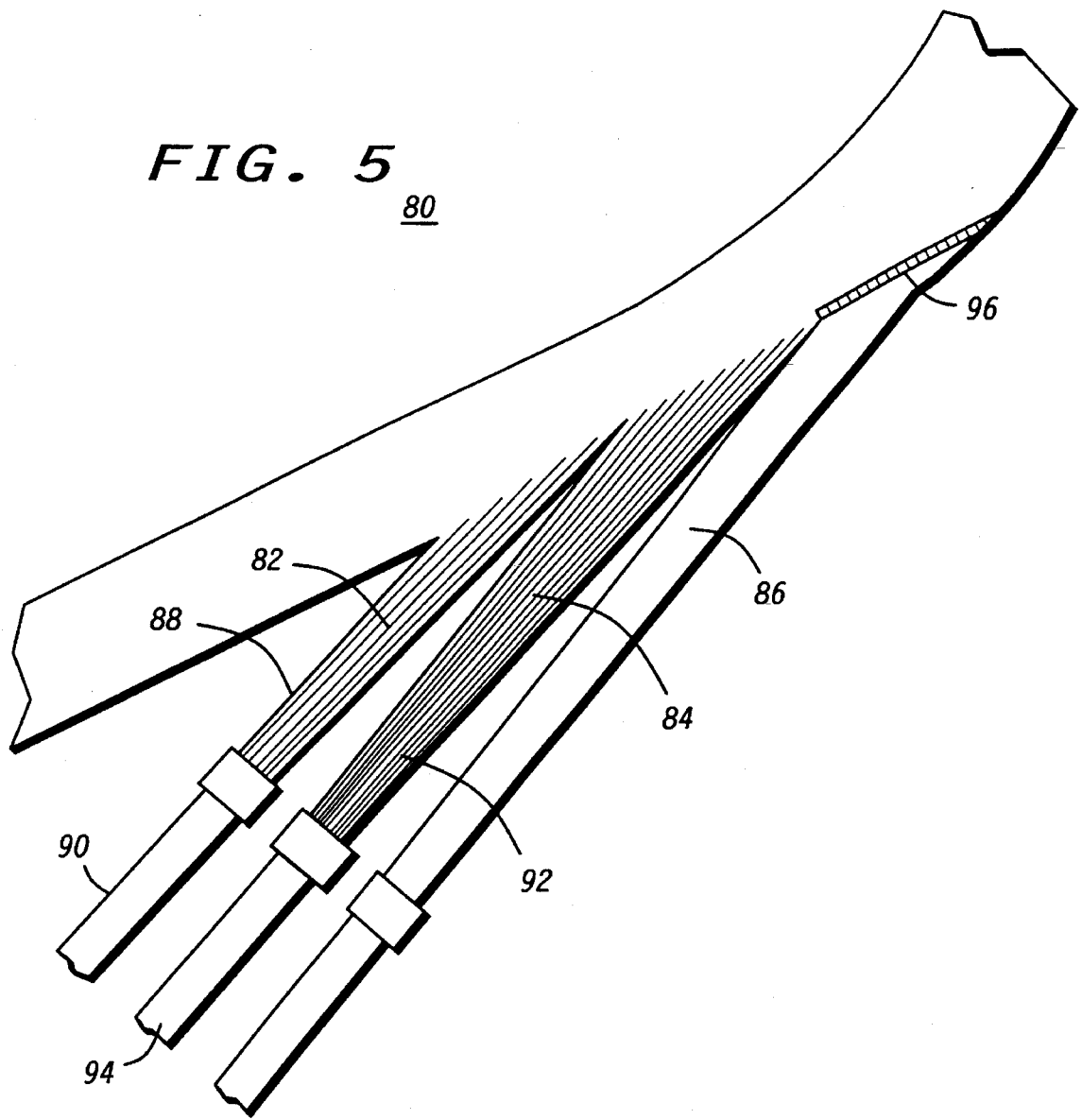
FIG. 5 is a cross-sectional view representing an improved interface.

Turning now to FIG. 5, FIG. 5 is a cross sectional view representing an improved interface. An interface 80 collects x-rays emitted from an x-ray source. The interface 80 comprises collecting funnels 82, 84 and 86. In one embodiment the collecting funnel 82 includes a plurality of mirrored light tubes 88. The mirrored light tubes 88 serve to funnel and collimate the x-rays to the beamline 90.

According to another embodiment, collecting funnel 84 includes a plurality of x-ray optical fibers 92. The optical fibers 92 collimate and collect the x-rays and direct them to beamline 94. The optical fibers 92 can be the standard x-ray optical fibers.

According to another embodiment, the receiving end of the collecting funnel 86 is covered with a diffraction grating 96. The diffraction grating 96 serves to direct and partially collimate the x-rays before they enter the collecting funnel 86.

Figure 6:
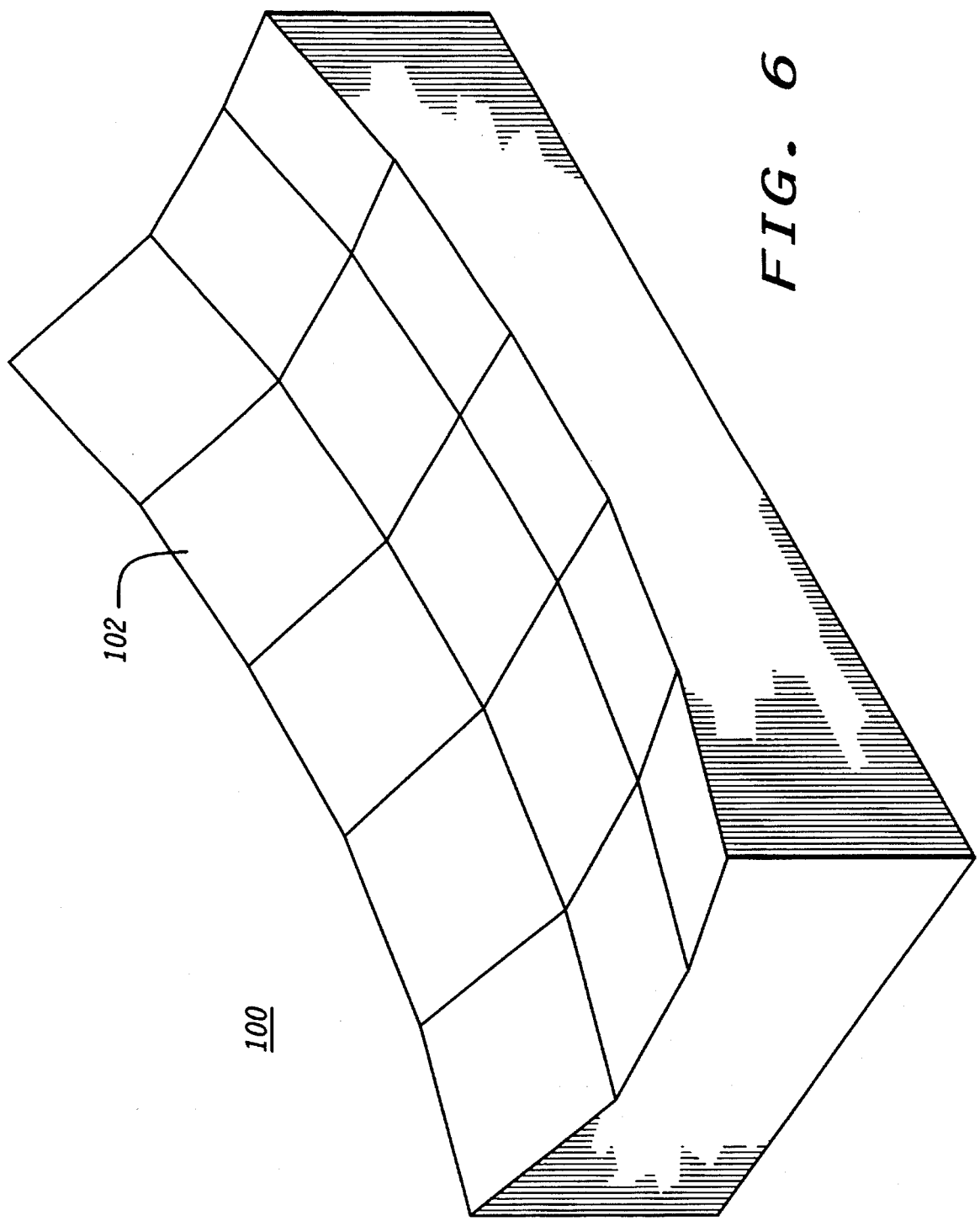
FIG. 6 is a partial view representing a mirrored funnel.

Turning now to FIG. 6, FIG. 6 is a partial view representing a mirrored funnel. A portion of a mirrored funnel 100 in one embodiment comprises a plurality of flat mirrors 102 arranged to funnel and collimate x-rays. For example, the plurality of flat mirrors 102 can be arranged in a torroidal, polynomial or parabolic shape depending on design. The shape can be variations on conventional mirrors such as those disclosed in U.S. Pat. Nos. 5,142,561 and 5,031,199, which patents are hereby incorporated herein by reference. Thus, in this manner a mirrored funnel can be shaped to collimate the x-rays for use down the beamline.

By now it will be recognized that an x-ray interface has been provided that collects a high efficiency, high intensity amount of x-rays and funnels these x-rays down beamlines for use in x-ray lithography.

While the invention has been particularly shown and described with reference to preferred embodiments, it will be understood by those skilled in the art that changes of form may be made without departing from the spirit and scope of the invention.

We claim:

1. An interface for collecting x-rays to at least one beamline, the interface comprising:

a housing including at least one mirrored funnel, said at least one mirrored funnel having a receiving end attached adjacent to an x-ray source and an exiting end attached to the at least one beamline, wherein the at least one mirrored funnel comprises a plurality of flat mirrors arranged to partially collimate the x-rays into a parallel beam.

2. An interface for collecting x-rays to at least one beamline, the interface comprising:

a housing including at least one mirrored funnel, said at least one mirrored funnel having a receiving end attached adjacent to an x-ray source and an exiting end attached to the at least one beamline; and a diffraction grating at the receiving end of the at least one mirrored funnel.

3. An interface for collecting x-rays to a plurality of beamlines for use in x-ray lithography, the interface comprising:

a housing including a plurality of mirrored funnels, each mirrored funnel having a receiving end and an exiting end, wherein each mirrored funnel condenses and directs the x-rays out the exiting end and to one of the plurality of beamlines, and wherein the plurality of mirrored funnels comprise a plurality of flat mirrors arranged to partially collimate the x-rays into parallel beams.

4. An interface for collecting x-rays to a plurality of beamlines for use in x-ray lithography, the interface comprising:

a housing including a plurality of mirrored funnels, each mirrored funnel having a receiving end and an exiting end, wherein each mirrored funnel condenses and directs the x-rays out the exiting end and to one of the plurality of beamlines: and a diffraction grating at the receiving end of each mirrored funnel.

* * * * *